United States Patent
Tang et al.

(10) Patent No.: US 10,276,225 B2
(45) Date of Patent: *Apr. 30, 2019

(54) METHOD AND SYSTEM FOR PROVIDING A MAGNETIC JUNCTION USABLE IN SPIN TRANSFER OR SPIN-ORBIT TORQUE APPLICATIONS AND INCLUDING A MAGNETIC BARRIER LAYER

(71) Applicant: Samsung Electronics Co., LTD., Gyeonggi-do (KR)

(72) Inventors: Xueti Tang, Fremont, CA (US); Dmytro Apalkov, San Jose, CA (US); Gen Feng, North Potomac, MD (US); Mohamad Towfik Krounbi, San Jose, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/903,926

(22) Filed: Feb. 23, 2018

(65) Prior Publication Data
US 2018/0197589 A1 Jul. 12, 2018

Related U.S. Application Data

(63) Continuation-in-part of application No. 15/177,138, filed on Jun. 8, 2016, now Pat. No. 9,917,249.
(Continued)

(51) Int. Cl.
*H01L 27/22* (2006.01)
*G11C 11/16* (2006.01)
(Continued)

(52) U.S. Cl.
CPC ........ *G11C 11/161* (2013.01); *G11C 11/1675* (2013.01); *H01L 27/222* (2013.01);
(Continued)

(58) Field of Classification Search
CPC ............. G11C 11/161; G11C 14/0081; G11C 11/5607; G11C 2211/5615; H01L 27/222; H01L 43/10; H01F 41/303
See application file for complete search history.

(56) References Cited

U.S. PATENT DOCUMENTS

| | | | |
|---|---|---|---|
| 2012/0012953 A1* | 1/2012 | Lottis | B82Y 25/00 257/421 |
| 2014/0056060 A1* | 2/2014 | Khvalkovskiy | H01L 27/228 365/158 |

(Continued)

*Primary Examiner* — William F Kraig
*Assistant Examiner* — Khatib A Rahman
(74) *Attorney, Agent, or Firm* — Van Pelt, Yi & James LLP

(57) ABSTRACT

A magnetic device and method for providing the magnetic device are described. The magnetic device includes magnetic junctions and spin-orbit interaction (SO) active layer(s). Each magnetic junction includes free and pinned layers separated by a nonmagnetic spacer layer. The pinned layer has a perpendicular magnetic anisotropy (PMA) energy greater than an out-of-plane demagnetization energy. The pinned layer includes a magnetic barrier layer between a magnetic layer and a high PMA layer including at least one nonmagnetic component. The magnetic barrier layer includes Co and at least one of Ta, W and Mo. The magnetic barrier layer is for blocking diffusion of the nonmagnetic component. The SO active layer(s) are adjacent to the free layer. The SO active layer(s) carry a current in-plane and exert a SO torque on the free layer due to the current. The free layer is switchable between stable magnetic states using the SO torque.

19 Claims, 6 Drawing Sheets

120

| Co Layer | 121 |
|---|---|
| Ta, W or Mo Layer | 122 |
| Co Layer | 121 |

Related U.S. Application Data

(60) Provisional application No. 62/305,727, filed on Mar. 9, 2016.

(51) Int. Cl.
  *H01L 43/12* (2006.01)
  *H01L 43/08* (2006.01)
  *H01L 43/10* (2006.01)

(52) U.S. Cl.
  CPC ............ *H01L 27/228* (2013.01); *H01L 43/08* (2013.01); *H01L 43/10* (2013.01); *H01L 43/12* (2013.01)

(56) References Cited

U.S. PATENT DOCUMENTS

| | | | |
|---|---|---|---|
| 2014/0264671 A1* | 9/2014 | Chepulskyy | H01L 43/08 257/421 |
| 2014/0327095 A1* | 11/2014 | Kim | H01L 43/08 257/421 |
| 2015/0021726 A1 | 1/2015 | Min | |
| 2016/0181508 A1* | 6/2016 | Lee | H01L 43/02 257/421 |

* cited by examiner

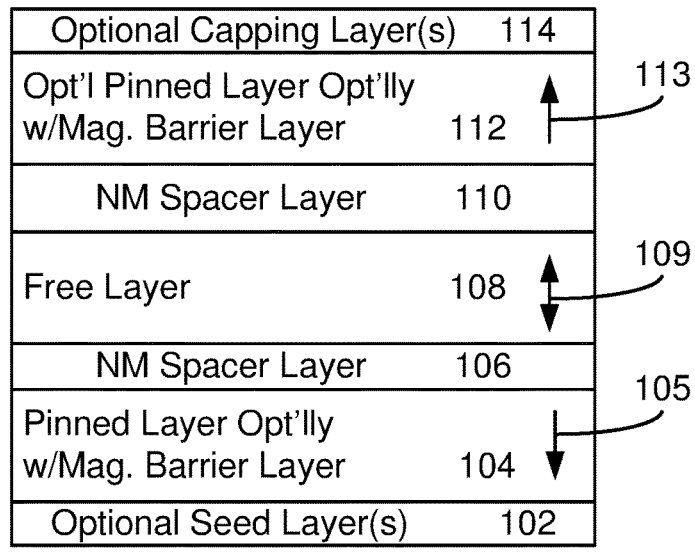
FIG. 1
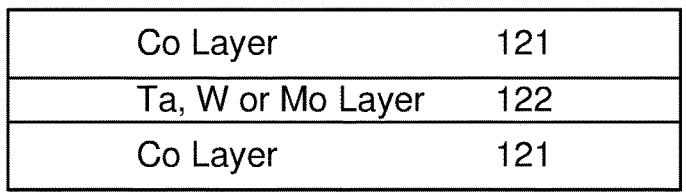
FIG. 2
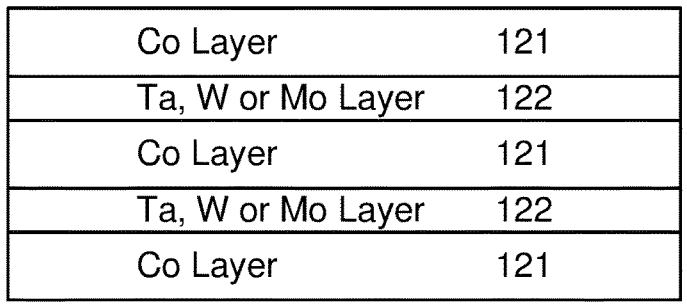
FIG. 3
Alloy of Co and Ta, W and/or Mo   120"
FIG. 4

METHOD AND SYSTEM FOR PROVIDING A MAGNETIC JUNCTION USABLE IN SPIN TRANSFER OR SPIN-ORBIT TORQUE APPLICATIONS AND INCLUDING A MAGNETIC BARRIER LAYER

CROSS-REFERENCE TO RELATED APPLICATIONS

This application is a continuation-in-part of patent application Ser. No. 15/177,138, filed Jun. 8, 2016, entitled "METHOD AND SYSTEM FOR PROVIDING A MAGNETIC JUNCTION USABLE IN SPIN TRANSFER TORQUE APPLICATIONS AND INCLUDING A MAGNETIC BARRIER LAYER, which claims the benefit of provisional Patent Application Ser. No. 62/305,727, filed Mar. 9, 2016, entitled TOP PL WITH IMPROVED THERMAL STABILITY, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ typically resides on a substrate. The conventional MTJ, uses conventional seed layer(s), may include capping layers and may include a conventional antiferromagnetic (AFM) layer. The conventional MTJ includes a conventional pinned layer, a conventional free layer and a conventional tunneling barrier layer between the conventional pinned and free layers. A bottom contact below the conventional MTJ and a top contact on the conventional MTJ may be used to drive current through the conventional MTJ in a current-perpendicular-to-plane (CPP) direction.

The conventional pinned layer and the conventional free layer are magnetic. The magnetization of the conventional pinned layer is fixed, or pinned, in a particular direction. The conventional free layer has a changeable magnetization. The conventional free layer may be a single layer or include multiple layers. The pinned layer and free layer may have their magnetizations oriented perpendicular to the plane of the layers (perpendicular-to-plane) or in the plane of the layers (in-plane).

To switch the magnetization of the conventional free layer, a current is driven perpendicular to plane. When a sufficient current is driven from the top contact to the bottom contact, the magnetization of the conventional free layer may switch to be parallel to the magnetization of a conventional bottom pinned layer. When a sufficient current is driven from the bottom contact to the top contact, the magnetization of the free layer may switch to be antiparallel to that of the bottom pinned layer. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. Mechanisms for improving the performance of STT-MRAM and other magnetic memories are desired. For example, current magnetic junctions may use various magnetic and nonmagnetic materials to provide the desired properties, such as a high perpendicular magnetic anisotropy for pinned layers. However, some such materials not be thermally stable. As a result, the pinned layer may be thermally unstable. For example, the stability of the pinned layer may be compromised due to fabrication or thermal cycling. Performance of the magnetic junction may be adversely affected. Accordingly, what is needed is a method and system that may improve the performance of the spin transfer torque based memories and other magnetic memories. The method and system described herein address such a need.

BRIEF SUMMARY OF THE INVENTION

A magnetic device and method for providing the magnetic device are described. The magnetic device includes magnetic junctions and spin-orbit interaction (SO) active layer(s). The magnetic junction includes free and pinned layers separated by a nonmagnetic spacer layer. The free layer is switchable between stable magnetic states using spin-orbit torque. The pinned layer has a pinned layer perpendicular magnetic anisotropy energy greater than a pinned layer out-of-plane demagnetization energy. The pinned layer includes a high perpendicular magnetic anisotropy (PMA) layer including at least one nonmagnetic component, a magnetic layer and a magnetic barrier layer between the high PMA layer and the magnetic layer. The magnetic barrier layer includes Co and at least one of Ta, W and Mo. The magnetic barrier layer is for blocking diffusion of the nonmagnetic component of the high PMA layer. The at least one SO active layer is adjacent to the free layer of the magnetic junction. The SO active layer(s) carry a current in-plane and exert a SO torque on the free layer due to the current passing through the SO active layer(s). The free layer is switchable between stable magnetic states using the SO torque.

BRIEF DESCRIPTION OF SEVERAL VIEWS OF THE DRAWINGS

FIG. 1 depicts an exemplary embodiment of a magnetic junction usable in magnetic devices such as a magnetic memory programmable using spin transfer torque and having thermally stable pinned layer(s).

FIG. 2 depicts an exemplary embodiment of a magnetic barrier layer usable in a pinned layer of a magnetic junction usable in magnetic devices.

FIG. 3 depicts another exemplary embodiment of a magnetic barrier layer usable in a pinned layer of a magnetic junction usable in magnetic devices.

FIG. 4 depicts another exemplary embodiment of a magnetic barrier layer usable in a pinned layer of a magnetic junction usable in magnetic devices.

DETAILED DESCRIPTION OF THE INVENTION

Figure 5:
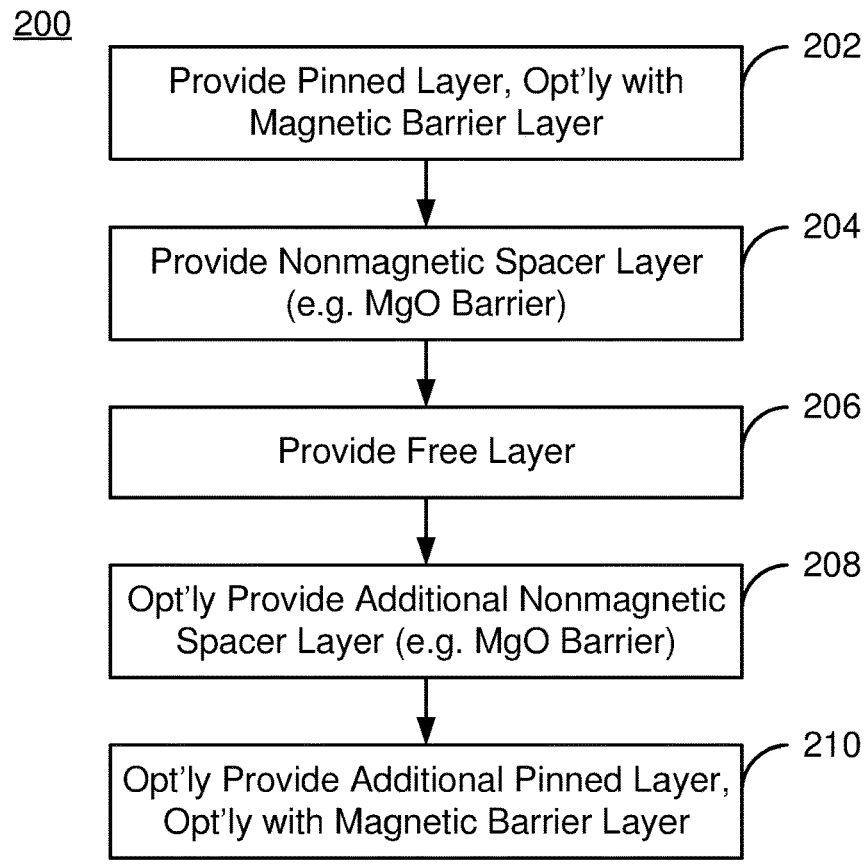
FIG. 5 is a flow chart depicting an exemplary embodiment of a method for providing a magnetic junction usable in magnetic devices such as a magnetic memory programmable using spin transfer torque and having a pinned layer including a magnetic barrier layer.

The exemplary embodiments relate to magnetic junctions usable in magnetic devices, such as magnetic memories, and the devices using such magnetic junctions. The magnetic memories may include spin transfer torque magnetic random access memories (STT-MRAMs) and/or spin-orbit coupling torque (SOT) magnetic memories. The magnetic memories may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic device and method for providing the magnetic device are described. The magnetic device includes magnetic junctions and spin-orbit interaction (SO) active layer(s). The magnetic junction includes free and pinned layers separated by a nonmagnetic spacer layer. The free layer is switchable between stable magnetic states using spin-orbit coupling torque. The pinned layer has a pinned layer perpendicular magnetic anisotropy energy greater than a pinned layer out-of-plane demagnetization energy. The pinned layer includes a high perpendicular magnetic anisotropy (PMA) layer including at least one nonmagnetic component, a magnetic layer and at least one magnetic barrier layer between the high PMA layer and the magnetic layer. The magnetic barrier layer includes Co and at least one of Ta, W and Mo. The magnetic barrier layer is for blocking diffusion of the nonmagnetic component of the high PMA layer. The at least one SO active layer is adjacent to the free layer of the magnetic junction. The SO active layer(s) carry a current in-plane and exert a SO torque on the free layer due to the current passing through the SO active layer(s). The free layer is switchable between stable magnetic states using the SO torque.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

FIG. 1 depicts an exemplary embodiment of a magnetic junction 100 usable in magnetic devices and having thermally stable pinned layer(s). For clarity, FIG. 1 is not to scale. The magnetic junction 100 may be used in a magnetic device such as a spin transfer torque magnetic random access memory (STT-MRAM) and, therefore, in a variety of electronic devices. The magnetic junction 100 may include a pinned layer 104 having a magnetic moment 105, a nonmagnetic spacer layer 106, a free layer 108 having magnetic moment 109, an optional additional nonmagnetic spacer layer 110, and an optional additional pinned layer 112 having magnetic moment 113. Also shown are optional seed layer(s) 102 and capping layer(s) 114. The substrate on which the magnetic junction 100 is formed resides below the seed layers and is not shown for simplicity. A bottom contact and a top contact are not shown but may be formed. Similarly, other layers may be present but are not shown for simplicity.

As can be seen in FIG. 1, the magnetic junction 100 is a dual magnetic junction. In another embodiment, the nonmagnetic spacer layer 110 and pinned layer 112 might be omitted. In such an embodiment, the magnetic junction 100 is a bottom pinned magnetic junction. Alternatively, the pinned layer 104 and nonmagnetic spacer layer 106 might be omitted. In such an embodiment, the magnetic junction 100 is a top pinned magnetic junction. Optional pinning layer(s) (not shown) may be used to fix the magnetization of the pinned layer(s) 104 and/or 112. In some embodiments, the optional pinning layer may be an AFM layer or multilayer that pins the magnetization(s) through an exchange-bias interaction. However, in other embodiments, the optional pinning layer may be omitted or another structure may be used. In the embodiment shown, the magnetic moments 105 and 113 of the pinned layers 104 and 112, respectively, are pinned by the magnetic anisotropy of the layers 104 and 112, respectively. The free layer 108 and the pinned layers 104 and 112 have a high perpendicular magnetic anisotropy (PMA). Stated differently, the perpendicular magnetic anisotropy energy exceeds the out-of-plane demagnetization energy for the layers 104, 108 and 112. Such a configuration allows for the magnetic moments 105, 109 and 113 of the layers 104, 108 and 112, respectively, having a high PMA to be stable perpendicular to plane.

The magnetic junction 100 is also configured to allow the free layer magnetic moment 109 to be switched between stable magnetic states when a write current is passed through the magnetic junction 100. Thus, the free layer 109 is switchable utilizing spin transfer torque when a write current is driven through the magnetic junction 100 in a current perpendicular-to-plane (CPP) direction. The direction of the magnetic moment 109 of the free layer 108 may be read by driving a read current through the magnetic junction 100.

The nonmagnetic spacer layer(s) 106 and 110 may be tunneling barrier layers. For example, the nonmagnetic spacer layer 106 and/or 110 may be a crystalline MgO tunneling barrier with a (100) orientation. Such nonmagnetic spacer layers 106 and 110 may enhance TMR of the magnetic junction 100.

The pinned layer(s) 104 and/or 112 have a PMA energy greater than a pinned layer out-of-plane demagnetization energy. Thus, the moments 105 and 113 are stable perpendicular-to-plane. In addition, one or both of the pinned layers 104 and 112 includes at least one magnetic barrier layer. More specifically, the pinned layer 104 and/or 112 includes at least one high PMA layer, at least one magnetic layer and at least one magnetic barrier layer between the high PMA layer(s) and the magnetic layer(s). The method and system are described herein in the context of a single magnetic barrier layer, a single high PMA layer and a single magnetic layer per pinned layer. However, in other embodiments, multiple magnetic barrier layers, multiple high PMA layers and/or multiple magnetic layers may be used.

The high PMA layer of the pinned layer 104 and/or 112 includes magnetic material(s) and at least one nonmagnetic component that may diffuse during fabrication or use of the magnetic junction 100. Such a nonmagnetic material may be Pt. For example, the high PMA layer may be a multilayer including multiple repeats of a Co/Pt bilayer (otherwise denoted or $(Co/Pt)_n$) and/or a CoPt alloy. Other possibilities for the high PMA layer include, but are not limited to a CoTb alloy, multiple repeats of a Co/Tb bilayer, multiple repeats of a CoTb/FeB bilayer, a FePd alloy, a FePdB alloy, a CoPd alloy, a FePt alloy, a TbCoFe alloy, a GaMn alloy, a GeMn alloy, multiple repeats of a Co/Pd bilayer, multiple repeats of a Fe/Pt bilayer, multiple repeats of a Co/Ni bilayer, multiple repeats of a Tb/CoFe bilayer, multiple repeats of a Co/Ir bilayer, and/or multiple repeats of a Co/TbCoFe bilayer. In such high PMA layers, the Pt, Pd, and/or Tb may tend to diffuse.

The magnetic layer of the pinned layer 104 and/or 112 may be closer to the nonmagnetic spacer layer 106 and/or 110 than the high PMA layer is. The magnetic layer of the pinned layer(s) 104 and/or 112 includes at least one glass-promoting component as-deposited. The magnetic layer is, therefore, amorphous as-deposited. Boron is the glass-promoting component described herein. However, multiple and/or other glass-promoting components may be used in other embodiments. For example, the magnetic layer may be a CoFeB and/or FeB. The CoFeB layer may be a $(CoFe)_{1-x}B_x$ layer, where x is at least 0.2 and not more than 0.5. For example, x may be nominally 0.4. In general, alloys mentioned herein do not indicate specific stoichiometries unless specifically mentioned. For example, the term CoFeB indicates an alloy of Co, Fe and B. The term CoFeB is intended to indicate an alloy having at least twenty percent and not more than fifty atomic percent B alloyed with CoFe, as discussed above. The term CoFeB is not intended to be restricted to an alloy having equal amounts of Co, Fe and B. Other magnetic layers and/or other glass-promoting components may be used. For example, the magnetic layer might may include one or more of CoB, Fe, $Co_2FeAl$, $Co_2FeAlSi$, $Co_2MnSi$ and MnAl in addition to or in lieu of CoFeB and/or FeB.

After fabrication, described below, the magnetic layer may be at least partially crystallized. In such embodiments, at least some of the glass-promoting component may be removed during fabrication. Thus, the magnetic layer may be glass-promoting component poor (e.g. boron poor). In some embodiments, the glass-promoting component may be removed completely. However, the magnetic layers are still described herein as including the glass-promoting component. For example, the magnetic layer may be described as a CoFeB layer even though the B may be partially or completely removed during fabrication.

The magnetic layer may be a high spin polarization layer. Thus, the magnetic layer may act as a polarization enhancement layer (PEL). The magnetic layer may also have a high PMA. Stated differently, the perpendicular magnetic anisotropy energy is greater than the out-of-plane demagnetization energy. Thus, despite being termed a "magnetic layer" instead of a high PMA magnetic layer, the magnetic layer may have its magnetic moment stable perpendicular-to-plane.

The magnetic barrier layer is between the high PMA layer and the magnetic layer. Thus, the magnetic barrier layer is wholly within the pinned layer 104 and/or 112. The magnetic barrier layer also is not at any interface of the pinned layer 104 and/or 112. Thus, the interface between the layers 104 and 106 and the interface between the layers 110 and 112 is not shared by the magnetic barrier layer. The magnetic barrier layer allows the desired materials to be included in the high PMA and magnetic layers while improving the thermal stability of the magnetic junction 100. More specifically, the magnetic barrier layer includes Co and at least one of Ta, W and Mo. For example, the magnetic barrier layer may be a multilayer including multiple Co layers sandwiching and interleaved with one or more layers of Ta, W and/or Mo. The nonmagnetic layers are, however, sufficiently thin that the Co layers are ferromagnetically coupled. Thus, the magnetic barrier layer remains ferromagnetic. As a result, the combination of the magnetic barrier layer, magnetic layer and high PMA layer magnetically act as a single layer.

For example, FIGS. 2, 3 and 4 depicts an exemplary embodiment of a magnetic barrier layer 120, 120' and 120" usable in a pinned layer of a magnetic junction usable in magnetic devices. FIGS. 2, 3 and 4 are not to scale. The magnetic barrier layer 120, 120' and/or 120" may be used in the pinned layer(s) 104 and/or 112. The magnetic barrier layer 120 includes two Co layers 121 that sandwich the nonmagnetic layer 122. The nonmagnetic layer 122 is formed from one or more of Ta, W and Mo. In general, only a single material (Ta only, W only or Mo only) is used. The magnetic barrier layer 120' includes three Co layers 121 interleaved with and sandwiching the nonmagnetic layers 122. The Co layers 121 may each be at least 1.5 Angstroms thick and not more than three Angstroms thick, while the nonmagnetic layer(s) 122 of Ta, W and/or Mo are at least 0.5 Angstroms thick and not more than 1.2 Angstroms thick. The nonmagnetic layers 122 are sufficiently thin that the Co layers 121 are magnetically coupled through the nonmagnetic layers 122. Thus, the barrier layers 120 and 120' are magnetic. Alternatively, the magnetic barrier layer 120" may be used. The magnetic barrier layer 120" may be an alloy of Co and one or more of Ta, W and Mo. The stoichiometry of the layer 120" may be analogous to that of the multilayers 120 and/or 120'. Thus, the magnetic barrier layer 120" is also ferromagnetic. The magnetic barrier layer is a barrier diffusion of the nonmagnetic mobile component of the high PMA layer. For example, the magnetic barrier layers 120, 120' and/or 120" may be a barrier to Pt diffusion. Further, because the magnetic barrier layer is magnetic, the magnetic layer and the high PMA layer remain magnetically coupled.

The magnetic junction 100 may have improved performance. Because the magnetic barrier layer, such as the layer 120, 120' and/or 120", is between the high PMA layer and the magnetic layer, the magnetic junction 100 may undergo higher temperatures without nonmagnetic constituents of the high PMA layer diffusing into the magnetic layer. For example, Pt in a Co/Pt multilayer may be prevented from diffusing in the CoFeB magnetic layer. The magnetic junction 100 may undergo thermal cycling to higher temperatures without adversely affecting the performance of the pinned layer(s) 104 and/or 112. The pinned layer(s) 104 and/or 112 may remain magnetically stable to higher temperatures. Thus, magnetoresistance and other properties of the magnetic junction 100 may maintain their values. Performance and thermal stability of the magnetic junction 100 may thus be improved.

FIG. 5 is a flow chart depicting an exemplary embodiment of a method 200 for providing a layer for magnetic junction usable in a magnetic device and including a magnetic barrier layer within the pinned layer(s). For simplicity, some steps may be omitted, performed in another order, include substeps and/or combined. Further, the method 200 start after other steps in forming a magnetic memory have been performed. The method 200 is described in the context of the magnetic junction 100 and magnetic barrier layer(s) 120, 120' and 120". However, the method 200 may be used in forming other magnetic junction(s). Further, multiple magnetic junctions may be simultaneously fabricated.

A pinned layer 104 may be provided, via step 202. Step 202 is performed if the entire dual magnetic junction 100 is to be formed or if a bottom pinned magnetic junction that omits the layers 110 and 112 is to be formed. Step 202 may include providing at least one high PMA layer, at least one magnetic layer and at least one magnetic barrier layer between the high PMA layer(s) and the magnetic layer(s) described above. If the magnetic barrier layer 120/120'/120" is not formed in the pinned layer 104 in step 202, then the magnetic barrier layer 120/120'/120" is formed in the remaining pinned layer 112.

The pinned layer 104 formed in step 202 may be a simple (single) layer or may include multiple layers. For example, the pinned layer formed in step 122 may be a synthetic antiferromagnet (SAF) including magnetic layers antiferromagnetically or ferromagnetically coupled through thin nonmagnetic layer(s), such as Ru. Each magnetic layer may also include multiple layers. In such a SAF one or both of the ferromagnetic layers includes the high PMA, magnetic barrier and magnetic layers. In some embodiments, one or both of ferromagnetic layers includes the high PMA, magnetic barrier and magnetic layer.

A nonmagnetic spacer layer 106 may be provided, via step 204. Step 204 is performed if the magnetic junction 100 or a bottom pinned magnetic junction is to be formed. In some embodiments, a crystalline MgO tunneling barrier layer may be desired for the magnetic junction being formed. Step 204 may include depositing MgO using, for example, radio frequency (RF) sputtering. In other embodiments, metallic Mg may be deposited and then oxidized in step 204 to provide a natural oxide of Mg. The MgO barrier layer/nonmagnetic spacer layer 106 may also be formed in another manner. Step 204 may include annealing the portion of the magnetic junction already formed to provide crystalline MgO tunneling barrier with a (100) orientation for enhanced TMR of the magnetic junction.

A free layer 108 is provided, via step 206. Step 206 includes depositing the material(s) for the free layer 108. If steps 202 and 204 are omitted, then the free layer may be deposited on seed layer(s). In such embodiments, a top pinned magnetic junction is fabricated. The seed layer(s) may be selected for various purposes including but not limited to the desired crystal structure of the free layer 108, magnetic anisotropy and/or magnetic damping of the free layer 108. For example, the free layer 108 may be provided on seed layer(s) 102 such as a crystalline MgO layer that promotes a perpendicular magnetic anisotropy in the free layer 108. If a dual magnetic junction or bottom pinned magnetic junction is fabricated, the free layer may be formed on a nonmagnetic spacer layer provided in step 204.

An additional nonmagnetic spacer layer 110 may be provided, via step 208. Step 208 is performed if a dual magnetic junction 100 or a top pinned magnetic junction is desired to be fabricated. If a bottom pinned magnetic junction is desired, then step 208 is omitted. In some embodiments, an additional crystalline MgO tunneling barrier layer may be desired for the magnetic junction being formed. Step 208 may thus be performed as described above with respect to step 204.

An additional pinned 112 layer may optionally be provided, via step 210. Step 210 may be performed if a dual magnetic junction or top pinned magnetic junction is desired to be fabricated. If a bottom pinned magnetic junction is desired, then step 210 is omitted. Step 210 may include providing high PMA layer(s), magnetic layer(s) and the magnetic barrier layer(s) between the high PMA and magnetic layers described above. If the magnetic barrier layer(s) 120/120'/120" are not formed in the pinned layer 112 in step 210, then the magnetic barrier layer(s) 120/120'/120" are formed in the remaining pinned layer 104. The pinned layer 112 formed in step 210 may be a simple (single) layer or may include multiple layers. For example, the pinned layer formed in step 210 may be a SAF. In such a SAF one or both of the ferromagnetic layers includes the high PMA, magnetic barrier and magnetic layers. In some embodiments, one or both of ferromagnetic layers includes the high PMA, magnetic barrier and magnetic layer.

Fabrication of the magnetic junction 100 may then be completed. For example, the capping layer(s) 114 may be deposited and the edges of the magnetic junction 100 defined, for example by providing a mask on the layers that have been deposited and ion milling the exposed portions of the layers. In some embodiments, an ion mill may be performed. Thus, the edges of the magnetic junction 100 may be defined after steps 202 through 210 are performed. Alternatively, the edges of various layers may be formed at other times. Additional structures, such as contacts and conductive lines may also be formed for the device in which the magnetic junction is used.

Using the method 200, the magnetic junction 100; a bottom pinned magnetic junction including the layers 104, 106 and 108; a top pinned magnetic junction including the layers 108, 110 and 112; or other magnetic junction incorporating at least one magnetic barrier layer such as the layer 120/120'/120" may be fabricated. Thus, a magnetic junction having pinned layer(s) with improved thermal stability may be achieved.

Figure 6:
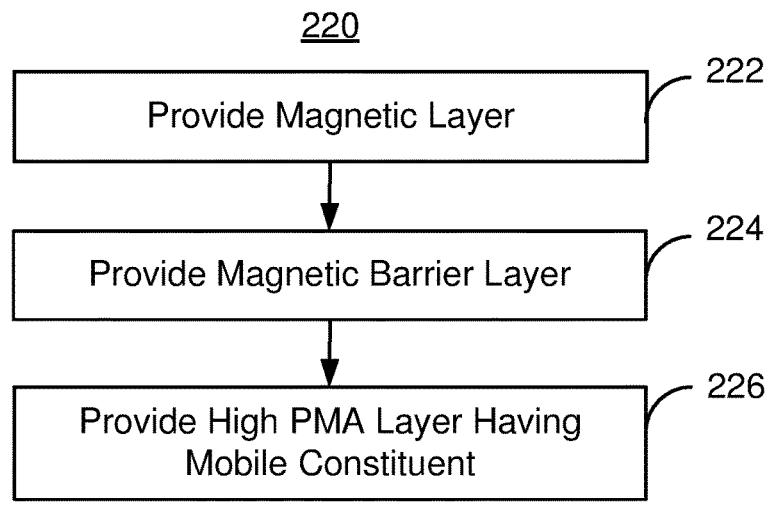
FIG. 6 is a flow chart depicting an exemplary embodiment of a method for providing a thermally stable pinned layer including a magnetic barrier layer.

FIG. 6 is a flow chart depicting an exemplary embodiment of a method 220 for providing a pinned layer for magnetic junction usable in a magnetic device and including a magnetic barrier layer within the pinned layer(s). For simplicity, some steps may be omitted, performed in another order, include substeps and/or combined. Further, the method 200 start after other steps in forming a magnetic memory have been performed. The method 220 is described in the context of the magnetic junction 100 and magnetic barrier layer(s) 120, 120' and 120". However, the method 220 may be used in forming other magnetic junction(s). Further, multiple magnetic junctions may be simultaneously fabricated.

A magnetic layer for the pinned layer 104/112 provided, via step 222. The magnetic layer has a high PMA and may have a glass-promoting component. Consequently, the magnetic layer is amorphous as-deposited. For example, a layer containing CoFeB and/or FeB may be deposited. In other embodiments, the magnetic layer having a high PMA deposited in step 222 may include one or more of CoB, Fe, $Co_2FeAl$, $Co_2FeAlSi$, $Co_2MnSi$ and MnAl. Step 222 may also include crystallizing the magnetic layer. For example, one or more sacrificial layers may be deposited on the magnetic layer. At least one of the sacrificial layers has a high affinity for the glass-promoting component. For example, material(s) such as Ta and/or W may be used as a sink for B. A sacrificial oxide layer, such as MgO, may optionally be deposited before the Ta or W sacrificial layer. An anneal is then performed. The sacrificial layer including high B affinity materials aids in removing the glass-promoting component from the magnetic layer and, therefore, in crystallizing the magnetic layer. The resulting magnetic layer may contain less (or zero) of the glass-promoting component after the anneal. The sacrificial layers are then removed, for example via a plasma etch. The presence of the oxide sacrificial layer aids reducing damage to the underlying magnetic layer during removal of the sacrificial layers.

At least one magnetic barrier layer is provided, via step 224. Step 224 may include providing the barrier layer(s) 120, 120' and/or 120". Such a magnetic barrier layer reduces or eliminates the migration of certain components in the high PMA layer, described below, during annealing or other heating of the magnetic junction. Thus, the properties of the resulting pinned layer 102 and/or 112 may be more stable. Because the barrier layer is magnetic, the magnetic layer provided in step 222 and the high PMA layer, provided below, may be magnetically coupled.

A high PMA layer is provided, via step 226. For example, a structure which has a high perpendicular magnetic anisotropy due to effects throughout the structure may be provided. The high PMA layer may be a Co/Pt multilayer. For example, a thicker Co layer, a thicker Pt layer and multiple repeats of a bilayer having thinner Co and/or Pt layers may be provided. In other embodiments, a CoPt alloy, a CoTb alloy, multiple repeats of a Co/Tb bilayer, multiple repeats of a CoTb/FeB bilayer, a FePd alloy, a FePdB alloy, a CoPd alloy, a FePt alloy, a TbCoFe alloy, a GaMn alloy, a GeMn alloy, multiple repeats of a Co/Pd bilayer, multiple repeats of a Fe/Pt bilayer, multiple repeats of a Co/Ni bilayer, multiple repeats of a Tb/CoFe bilayer, multiple repeats of a Co/Ir bilayer, and/or multiple repeats of a Co/TbCoFe bilayer may be formed in step 226. In addition, steps 222, 224 and 226 may be repeated in formation of a thicker multilayer.

Thus, a pinned layer such as the layers 104 and/or 112 may be formed using the method 220. Such a pinned layer may have a high PMA and, therefore, a magnetic moment that is stable perpendicular-to-plane. Magnetoresistance, such as tunneling magnetoresistance TMR of a magnetic junction using the pinned layer 104 and/or 112 may be enhanced. Such a pinned layer 104 and/or 112 may have improved thermal stability because of the presence of the magnetic barrier layer in conjunction with a high PMA. Thus, performance the magnetic junction may be improved.

Figure 7:
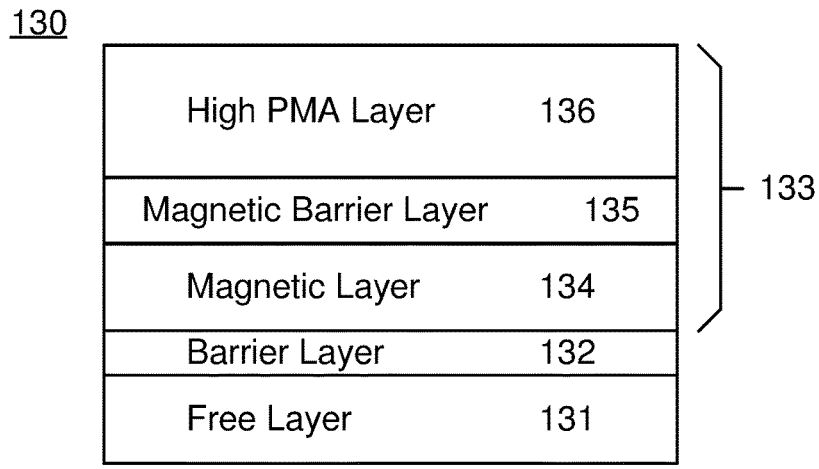
FIG. 7 depicts an exemplary embodiment of a magnetic junction usable in magnetic devices such as a magnetic memory programmable using spin transfer torque and having a thermally stable pinned layer.

FIG. 7 depicts an exemplary embodiment of a magnetic junction 130 usable in magnetic devices such as a magnetic memory programmable using spin transfer torque and having a thermally stable pinned layer. For clarity, FIG. 7 is not to scale. The magnetic junction 130 may be used in a magnetic device such as a STT-MRAM and, therefore, in a variety of electronic devices. The magnetic junction 130 includes a free layer 131, a nonmagnetic spacer layer that is a tunneling barrier layer 132 and a pinned layer 133. Seed layer(s) and/or capping layer(s) may be present but are not shown for simplicity. A bottom contact and a top contact are not shown but may be formed. In the embodiment shown, the free layer 131 is on the bottom of the structure and may be closer to the underlying substrate (not shown). However, in an alternate embodiment, the order of the layers 131, 132 and 133 may be reversed. Thus, the magnetic junction 130 may be a bottom pinned or a top pinned magnetic junction.

The magnetic junction 130 may be viewed as a special case of the magnetic junction 100, in which only one pinned layer 131 is present.

The free layer 131 is analogous to the free layer 108. The magnetic junction 130 is also configured to allow the free layer 131 to be switched between stable magnetic states when a write current is passed through the magnetic junction 130. Thus, the free layer 131 is switchable utilizing spin transfer torque when a write current is driven through the magnetic junction 130 in a CPP direction. The data stored in the magnetic junction 130, and thus the direction of magnetization of the free layer 131, may be read by driving a read current through the magnetic junction 220.

The barrier layer 132 is analogous to the nonmagnetic spacer layer 106 or 110. Thus, the barrier layer 132 may be a crystalline MgO layer having the desired crystal structure, orientation and thickness.

The pinned layer 133 includes a magnetic layer 134, a magnetic barrier layer 135 and a high PMA layer 136. Although not expressly labeled as a high PMA layer, the magnetic layer 134 also has a high PMA. The magnetic layer is analogous to the magnetic layer described above as being provided in step 222. Thus, the magnetic layer 134 may be a CoFeB or FeB layer in some embodiments. The magnetic barrier layer 134 is analogous to the layers 120, 120' and/or 120" and is provided in step 222. Thus, the magnetic barrier layer 135 includes Co and at least one of Ta, W and Mo. The magnetic barrier layer 135 is between the layers 134 and 136 of the pinned layer 133. Thus, the magnetic barrier layer 135 is contained completely within the pinned layer 133 and is not located at an interface of the pinned layer 133. The magnetic barrier layer 135 magnetically couples the layers 134 and 136. The magnetic barrier layer 135 may also reduce or prevent diffusion of one or more constituents of the high PMA layer 136 into the magnetic layer 134. The magnetic barrier layer 135 allows the layers 134, 135 and 136 to function as a single layer magnetically while maintaining thermal stability of the pinned layer 133.

The high PMA layer 136 may be formed using step 226 of the method 220. Thus, the high PMA layer has a perpendicular magnetic anisotropy energy that exceeds the out-of-plane demagnetization energy due to effects through the bulk of the layer 136. For example, the high PMA layer 136 may include a Co/Pt multilayer or other analogous structure.

The magnetic junction 130 may have improved performance due to the presence of the magnetic barrier layer 135. The magnetic barrier layer 135 includes Co and at least one of Ta, W and Mo. Thus, the magnetic barrier layer 135 may provide the appropriate seed structure for the high PMA layer. The high PMA layer 136 having the desired crystal structure and magnetic characteristics may thus be formed. Because the magnetic barrier layer 135 is between the high PMA layer 136 and the magnetic layer 134, the magnetic junction 130 may undergo higher temperatures without nonmagnetic constituents of the high PMA layer 136 (e.g. Pt) diffusing into the magnetic layer 134. The magnetic junction 130 may undergo thermal cycling to higher temperatures without adversely affecting the performance of the pinned layer 133. Thus, the pinned layer 133 may remain magnetically stable to higher temperatures. As a result, magnetoresistance and other properties of the magnetic junction 130 may maintain their values. Performance and thermal stability of the magnetic junction 130 may thus be improved.

Figure 8:
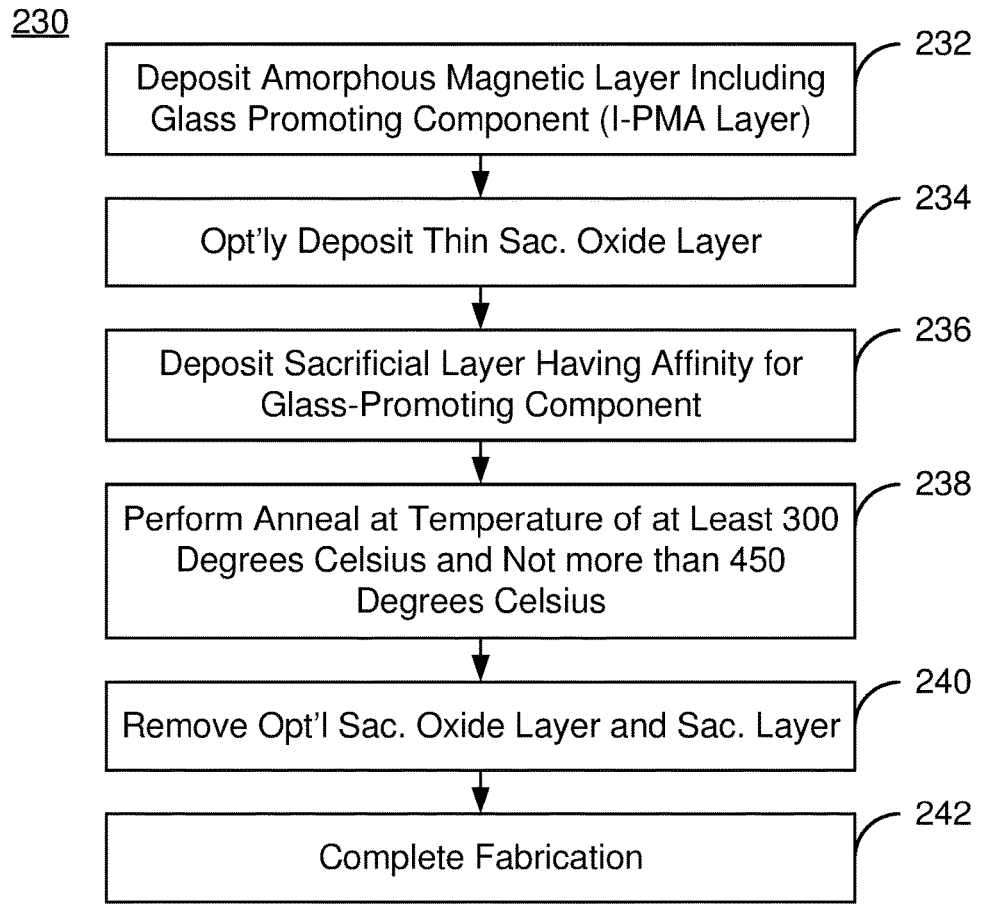
FIG. 8 is a flow chart depicting another exemplary embodiment of a method for providing a portion of a thermally stable pinned layer for a magnetic junction usable in magnetic devices.

In order to provide the desired magnetic layer 134 and high PMA layer 136, various procedures may be followed. FIG. 8 is a flow chart depicting an exemplary embodiment of a method 230 that utilizes sacrificial oxide and sacrificial layers for providing a pinned layer. For simplicity, some steps may be omitted, performed in another order, include substeps and/or combined. Further, the method 230 may start after other steps in forming a magnetic memory have been performed. The method 230 is described in the context of the magnetic junction 130, as well as the magnetic junctions 150, 150', 160 and 180 (discussed below). However, analogous layer for other magnetic junctions may be formed. Further, multiple layers for multiple magnetic junctions may be simultaneously fabricated.

A magnetic layer including at least one glass-promoting component is deposited, via step 232. Because of the presence of the glass-promoting component, the magnetic layer is amorphous as-deposited. For example, a layer containing CoFeB and/or FeB may be deposited.

A sacrificial oxide layer is optionally deposited in step 234. In other embodiments, step 234 is omitted. The sacrificial oxide layer may be an MgO layer. The sacrificial oxide layer is desired to be thin. The sacrificial oxide layer may be not more than five Angstroms thick and greater than zero Angstroms thick. For example, the sacrificial oxide layer may be nominally three through four Angstroms thick.

A sacrificial layer is deposited, via step 236. The sacrificial layer is a sink for the glass-promoting component. Stated differently, the sacrificial layer has a high affinity for the glass-promoting component. The sacrificial layer may include one or more of Ta, Hf, Rb, Sc, Zr, Nb, Mg, V, Mn, Ag, Be, Mo, Ti, Cr, Al, Te and W. In some embodiments, the sacrificial layer includes at least one of W, Ta and Mo which have a high affinity for B. The sacrificial layer is also desired to be thin. For example, in some embodiments, the sacrificial layer may be at least two Angstroms thick and not more than five Angstroms thick. For example, the sacrificial layer may be nominally three through four Angstroms thick. The sacrificial oxide layer is sufficiently thin that the glass-promoting component may migrate through the layer to the layer during an anneal, discussed below.

Once the sacrificial layer is present, an anneal is performed, via step 238. The anneal is at an anneal temperature greater than two hundred degrees Celsius. In some embodiments, the anneal temperature is at least three hundred degrees Celsius and not more than four hundred seventy-five degrees Celsius. In some such embodiments, the anneal is at a temperature of at least three hundred fifty degrees Celsius and not more than four hundred fifty degrees. For example, in some embodiments, the anneal temperature is nominally three hundred fifty degrees Celsius. In other embodiments, the anneal temperature is nominally four hundred fifty degrees Celsius. In other embodiments, other temperatures and times may be used. The anneal carried out in step 238 may be a rapid thermal anneal (RTA) having a duration on the order of twenty minutes or less. In some embodiments, the RTA is performed for not more than ten minutes. Because of the anneal, the amorphous magnetic layer provided in step 232 is at least partially crystallized.

Because of the presence of the sacrificial layer and the low thickness of the sacrificial oxide layer (if present), the glass-promoting component (such as B) in the magnetic layer tends to migrate to the sacrificial layer. Consequently, the stoichiometry of the magnetic layer may change during the anneal performed in step 238. For example, a CoFeB layer or FeB used for the magnetic layer may become B poor. In some embodiments, a crystalline CoFe layer remains and all of the B has diffused into the sacrificial layer. However, such a layer is still referred to as a CoFeB layer. After partial crystallization, the crystallized portion of the magnetic layer has the desired crystal structure and orientation. For example, the CoFeB or FeB layer may have a body-centered cubic crystal structure and a (100) orientation.

The sacrificial layer and sacrificial oxide layer (if present) are removed, via step 240. In some embodiments, this is accomplished by plasma etching the magnetic junction being formed. Thus, nonreactive ions, such as Ar ions, may be used to bombard the surface of the layer. In some embodiments, a portion of the magnetic layer is also removed. Although the sacrificial layers have been removed, some residue from one or both of these layers may remain. For example, the residue may include Mg, MgO, W and/or Ta. In other embodiments, no residue remains after step 240. If the etch is carried out to remove a portion of the magnetic layer, then the magnetic layer may be thinner than as-deposited.

Fabrication of the layer may then be completed, via step 242. In some embodiments, step 242 includes depositing one or more additional layers. For example, the magnetic barrier layer 135 and an additional high PMA layer 136, such as CoFeB, may be deposited. Alternatively, other high PMA layer(s) may be formed. For example, Co/Pt multilayer or other analogous layer(s) may be provided. Thus, the method 230 may be used to form the desired pinned layer.

Figure 9:
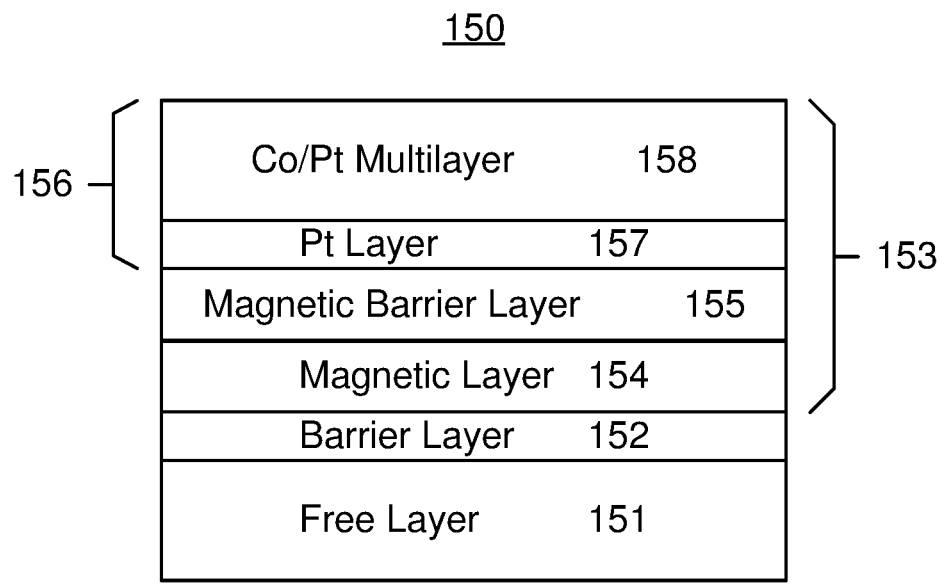
FIG. 9 depicts another exemplary embodiment of a magnetic junction usable in magnetic devices such as a magnetic memory programmable using spin transfer torque and having a thermally stable pinned layer.

FIG. 9 depicts an exemplary embodiment of a magnetic junction 150 usable in magnetic devices such as a magnetic memory programmable using spin transfer torque and having a thermally stable pinned layer. The magnetic junction 150 may be formed using the methods 200, 220 and 230. For clarity, FIG. 9 is not to scale. The magnetic junction 150 may be used in a magnetic device such as a STT-MRAM and, therefore, in a variety of electronic devices. The magnetic junction 150 is analogous to the magnetic junctions 100 and/or 130. The magnetic junction 150 includes a free layer 151, a nonmagnetic spacer layer that is a tunneling barrier layer 152 and a top pinned layer 153. Seed layer(s) and/or capping layer(s) may be present but are not shown for simplicity. A bottom contact and a top contact are not shown but may be formed. In the embodiment shown, the free layer 151 is on the bottom of the structure and may be closer to the underlying substrate (not shown).

The free layer 151 is analogous to the free layer(s) 108 and/or 131. The magnetic junction 150 is also configured to allow the free layer 151 to be switched between stable magnetic states when a write current is passed through the magnetic junction 150. Thus, the free layer 151 is switchable utilizing spin transfer torque when a write current is driven through the magnetic junction 150 in a CPP direction. The barrier layer 152 is analogous to the nonmagnetic spacer layer 106, 110 and/or 132. Thus, the barrier layer 152 may be a crystalline MgO layer having the desired crystal structure, orientation and thickness.

The pinned layer 153 includes a magnetic layer 154, a magnetic barrier layer 155 and a high PMA layer 156 that are analogous to the magnetic layer 134, the magnetic barrier layer 135 and a high PMA layer 136, respectively. The high PMA layer 156 includes a Pt layer 157 and a Co/Pt multilayer 158. In the high PMA layer 156, the Co and Pt layers are interleaved. Thus, a Co layer of the Co/Pt multilayer 158 adjoins the Pt layer 157. The magnetic layer 154 may be a CoFeB or FeB layer in some embodiments. The magnetic barrier layer 155 is analogous to the layers 120, 120' and/or 120''. Thus, the magnetic barrier layer 155 includes Co and at least one of Ta, W and Mo. The magnetic barrier layer 155 magnetically couples the layers 154 and 156. Stated differently, the magnetic barrier layer 155 allows the layers 154, 155 and 156 to function as a single layer magnetically. The magnetic barrier layer 155 may also reduce or prevent diffusion of Pt in the high PMA layer 156 into the magnetic layer 154.

The magnetic junction 150 may have improved performance due to the presence of the magnetic barrier layer 155. The magnetic barrier layer 155 includes Co and at least one of Ta, W and Mo. Thus, the magnetic barrier layer 155 may provide the appropriate seed structure for the high PMA layer 156. The magnetic barrier layer 155 allows the magnetic junction 150 to be subjected to higher temperatures without Pt from the layer 156 diffusing into the magnetic layer 154. Thus, the pinned layer 153 may remain magnetically stable to higher temperatures. Because the magnetic layer 154 is fabricated using the sacrificial layer of the method 230, the crystallization of the layer 154 may be improved. Thus, PMA and TMR may be improved. Further, use of the sacrificial oxide layer may allow for greater uniformity and repeatability of these improvements. As a result, magnetoresistance and other properties of the magnetic junction 150 may maintain their values. Performance and thermal stability of the magnetic junction 150 may thus be improved.

Figure 10:
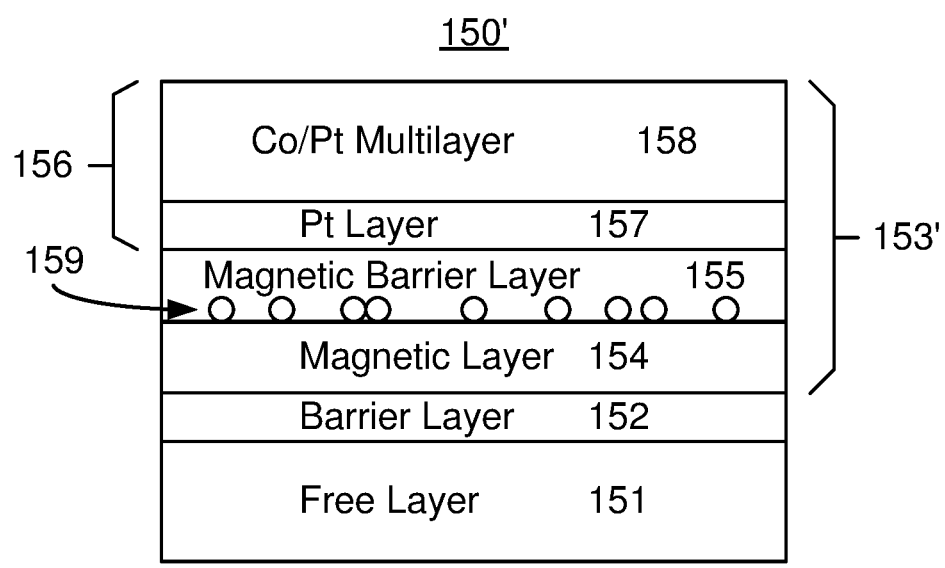
FIG. 10 depicts another exemplary embodiment of a magnetic junction usable in magnetic devices such as a magnetic memory programmable using spin transfer torque and having a thermally stable pinned layer.

FIG. 10 depicts an exemplary embodiment of a magnetic junction 150' usable in magnetic devices such as a magnetic memory programmable using spin transfer torque and having a thermally stable pinned layer. The magnetic junction 150' may be formed using the methods 200, 220 and 230. For clarity, FIG. 10 is not to scale. The magnetic junction 150' may be used in a magnetic device such as a STT-MRAM and, therefore, in a variety of electronic devices. The magnetic junction 150' is analogous to the magnetic junctions 100, 130 and/or 150. The magnetic junction 150' includes a free layer 151, a nonmagnetic spacer layer that is a tunneling barrier layer 152 and a top pinned layer 153' that are analogous to the free layer 151, the tunneling barrier layer. Seed layer(s) and/or capping layer(s) may be present but are not shown for simplicity. A bottom contact and a top contact are not shown but may be formed. In the embodiment shown, the free layer 151 is on the bottom of the structure and may be closer to the underlying substrate (not shown).

As discussed above, the free layer 151, barrier layer 152 and pinned layer 153' are analogous to the free layers, barrier layers and pinned layers already discussed. In addition, the pinned layer 153' includes residue 159. As discussed above, the magnetic junction 150' may be formed using the method 230, which uses a sacrificial oxide layer and a sacrificial layer in forming the magnetic barrier layer 155. Although these layers may be completely removed, some residue due to the material(s) in these sacrificial layers may remain on the magnetic layer 154. This residue 159 may include MgO, Ta, W and/or Mo which were in the sacrificial layers. The residue 159 does not form a full layer, but is inferred to be present.

The magnetic junction 150' may share the benefits of the magnetic junction 150. The magnetic junction 150 may have improved thermal robustness and TMR. Performance and thermal stability of the magnetic junction 150' may thus be improved.

Figure 11:
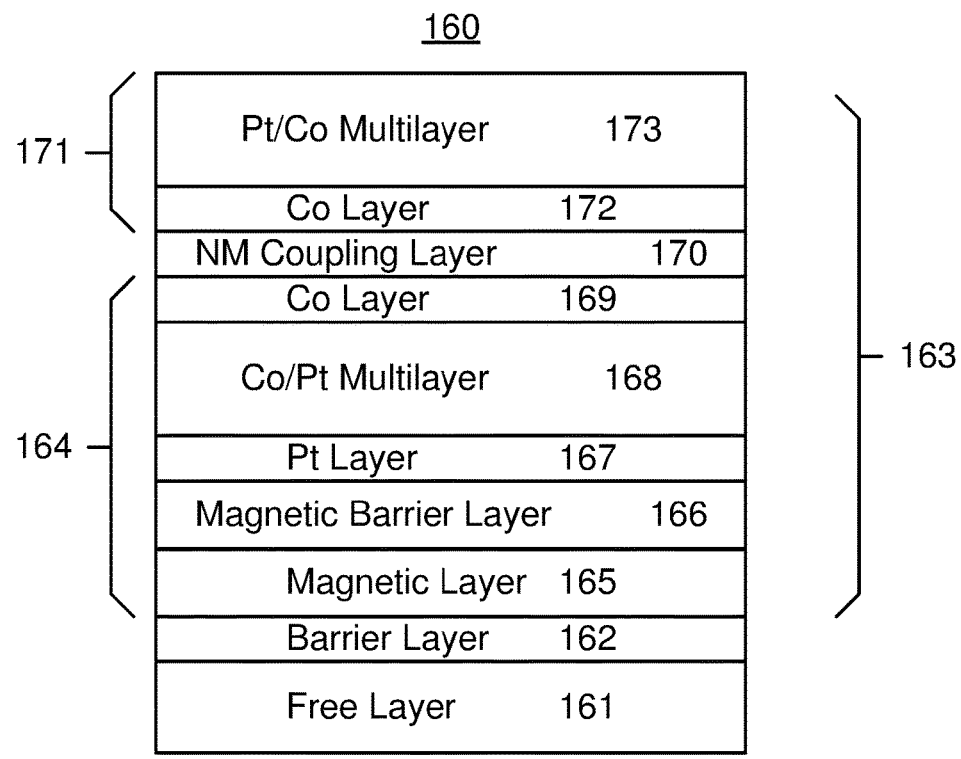
FIG. 11 depicts another exemplary embodiment of a magnetic junction usable in magnetic devices such as a magnetic memory programmable using spin transfer torque and having a thermally stable pinned layer.

FIG. 11 depicts an exemplary embodiment of a magnetic junction 160 usable in magnetic devices such as a magnetic memory programmable using spin transfer torque and having a thermally stable pinned layer. The magnetic junction 160 may be formed using the methods 200, 220 and 230. For clarity, FIG. 11 is not to scale. The magnetic junction 160 may be used in a magnetic device such as a STT-MRAM and, therefore, in a variety of electronic devices. The magnetic junction 160 is analogous to the magnetic junctions 100, 130, 150 and/or 150'. The magnetic junction 160 includes a free layer 161, a nonmagnetic spacer layer that is a tunneling barrier layer 162 and a top pinned layer 163. Seed layer(s) and/or capping layer(s) may be present but are not shown for simplicity. A bottom contact and a top contact are not shown but may be formed. In the embodiment shown, the free layer 161 is on the bottom of the structure and may be closer to the underlying substrate (not shown).

The free layer 161 is analogous to the free layer(s) 108, 131 and/or 151. The magnetic junction 160 is also configured to allow the free layer 161 to be switched between stable magnetic states when a write current is passed through the magnetic junction 160. The barrier layer 162 is analogous to the nonmagnetic spacer layer 106, 110, 132 and/or 152. Thus, the barrier layer 162 may be a crystalline MgO layer having the desired crystal structure, orientation and thickness.

The pinned layer 163 is a SAF. Thus, the pinned layer includes a magnetic structure 164, a nonmagnetic coupling layer 170 and an additional magnetic structure 171. The magnetic structure 164 is analogous to the pinned layer 153. The magnetic structure 164 thus includes a magnetic layer 165, a magnetic barrier layer 166 and a high PMA layer including layers 167 and 168 that are analogous to the magnetic layer 134/154, the magnetic barrier layer 135/155 and a high PMA layer 136/156 including layers 157 and 158, respectively. Although not shown, in some embodiments, the magnetic structure 164 may include residue of sacrificial layer(s) that is analogous to the residue 159. The nonmagnetic coupling layer 170 may be a Ru layer having a thickness set such that the structures 164 and 171 are antiferromagnetically coupled. The magnetic structure 171 is a high PMA structure. The magnetic structure 171 thus includes a Co layer 172 and a Pt/Co multilayer 173. In the magnetic structure 171, the Pt and Co layers are interleaved.

The magnetic junction 160 may share the benefits of the magnetic junctions 150 and/or 150'. The magnetic junction may have improved robustness due to the magnetic barrier layer 166. The magnetic barrier layer 166 allows the magnetic junction 160 to undergo higher temperatures without Pt from the layers 167 and 168 diffusing into the magnetic layer 165. Thus, the pinned layer 163 may remain magnetically stable to higher temperatures. Because the magnetic layer 165 is fabricated using the sacrificial layer of the method 230, the crystallization of the layer 165 may be improved. Thus, PMA and TMR may be improved. Further, use of the sacrificial oxide layer may allow for greater uniformity and repeatability of these improvements. As a result, magnetoresistance and other properties of the magnetic junction 160 may maintain their values. Performance and thermal stability of the magnetic junction 160 may thus be improved.

Figure 12:
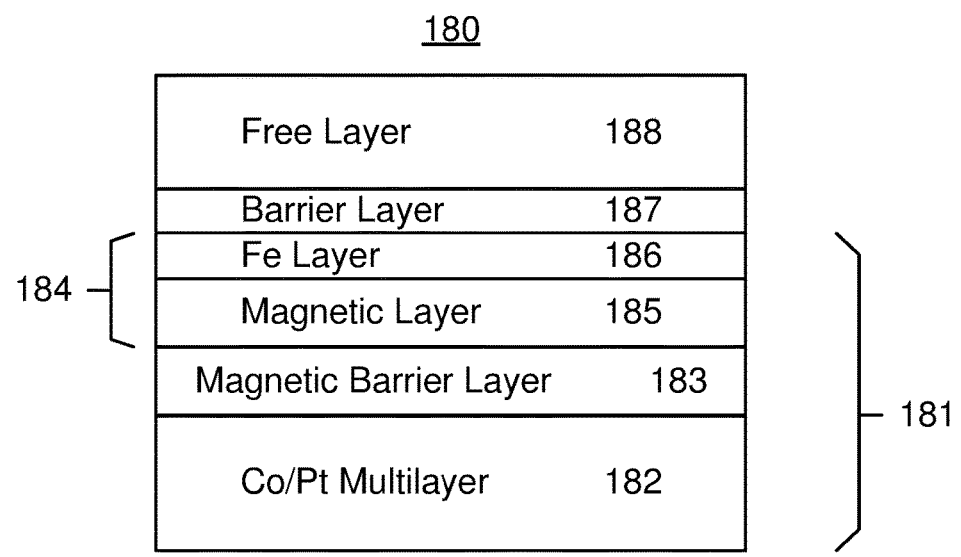
FIG. 12 depicts another exemplary embodiment of a magnetic junction usable in magnetic devices such as a magnetic memory programmable using spin transfer torque and having a thermally stable pinned layer.

FIG. 12 depicts an exemplary embodiment of a magnetic junction 180 usable in magnetic devices such as a magnetic memory programmable using spin transfer torque and having a thermally stable bottom pinned layer. The magnetic junction 180 may be formed using the methods 200, 220 and 230. For clarity, FIG. 12 is not to scale. The magnetic junction 180 may be used in a magnetic device such as a STT-MRAM and, therefore, in a variety of electronic devices. The magnetic junction 180 is analogous to the magnetic junctions 100, 130, 150, 150' and/or 160. The magnetic junction 180 includes a bottom pinned layer 181, a nonmagnetic spacer layer that is a tunneling barrier layer 187 and a top free layer 188. Seed layer(s) and/or capping layer(s) may be present but are not shown for simplicity. A bottom contact and a top contact are not shown but may be formed. In the embodiment shown, the pinned layer 181 is on the bottom of the junction 80 and may be closer to the underlying substrate (not shown).

The free layer 188 is analogous to the free layer(s) 108, 131, 151 and/or 161. The magnetic junction 180 is also configured to allow the free layer 188 to be switched between stable magnetic states when a write current is passed through the magnetic junction 188. The barrier layer 187 is analogous to the nonmagnetic spacer layer 106, 110, 132, 152 and/or 162. Thus, the barrier layer 187 may be a crystalline MgO layer having the desired crystal structure, orientation and thickness.

The pinned layer 181 is a bottom pinned layer. Thus, the pinned layer includes a high PMA layer 182, a magnetic barrier layer 183 and a magnetic layer 184 including layers 185 and 186. The high PMA layer 182, magnetic barrier layer 183 and magnetic layer 184 are analogous to the magnetic layer 134/154/165, the magnetic barrier layer 135/155/166 and a high PMA layer 136/156/167 and 168 including layers 157/167 and 158/168, respectively. However, the high PMA layer 182 is formed before the magnetic layer 184. Although not shown, in some embodiments, the magnetic layer 184 may include residue of sacrificial layer(s) that is analogous to the residue 159. The magnetic layer 185 may be a CoFeB and/or FeB layer. The layer 186 has a high spin polarization and may be an Fe layer. Because the magnetic barrier layer 183 is magnetic, the layers 182, 183, 185 and 186 are magnetically coupled and function as a single magnetic layer.

The magnetic junction 180 may share the benefits of the magnetic junctions 150, 150' and/or 160. The magnetic junction 180 may have improved thermal robustness due to the magnetic barrier layer 183. Thus, the pinned layer 181 may remain magnetically stable to higher temperatures. Because the magnetic layer 185 is fabricated using the sacrificial layer of the method 230, the crystallization of the layer 185 may be improved. Thus, PMA and TMR may be improved. Further, use of the sacrificial oxide layer may allow for greater uniformity and repeatability of these improvements. As a result, magnetoresistance and other properties of the magnetic junction 180 may maintain their values. Performance and thermal stability of the magnetic junction 180 may thus be improved.

Although the method and apparatus have been described in the context of specific features, steps and components, one of ordinary skill in the art will recognize that one or more of these features, steps and/or components may be combined in other manners not inconsistent with the description herein.

Figure 13:
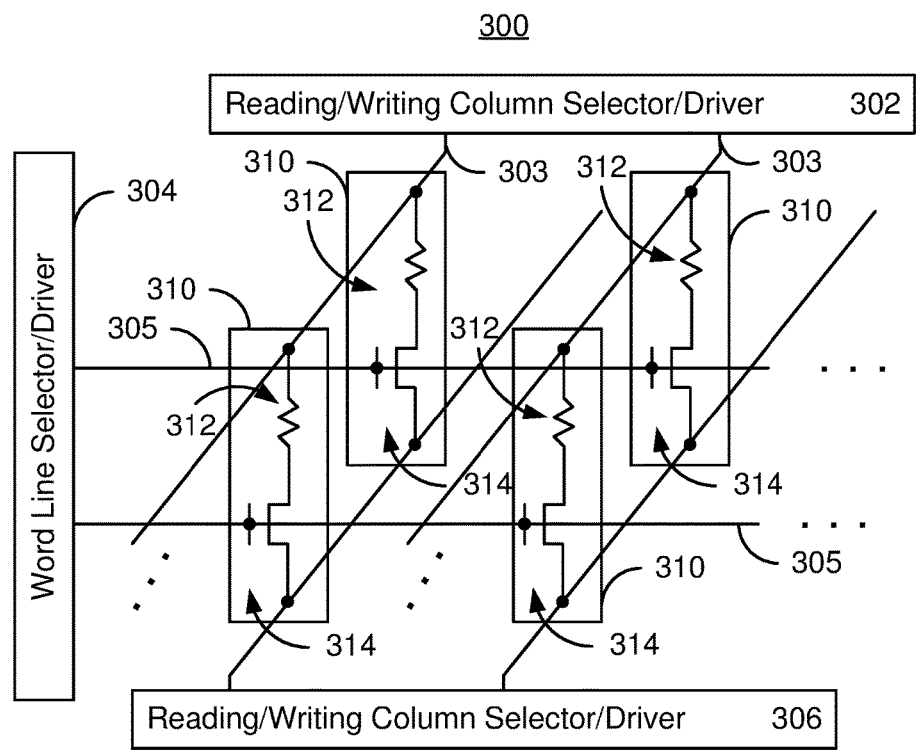
FIG. 13 depicts an exemplary embodiment of a memory utilizing magnetic junctions in the memory element(s) of the storage cell(s).

FIG. 13 depicts an exemplary embodiment of a memory 300 that may use one or more of the magnetic junctions 100, 130, 150, 150', 160, 180 and/or other magnetic junction including the magnetic barrier layer within the pinned layer. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the 100, 130, 150, 150', 160, 180 and/or other magnetic junction including the magnetic barrier layer within the pinned layer. Although one magnetic junction 312 is shown per cell 310, in other embodiments, another number of magnetic junctions 312 may be provided per cell. As such, the magnetic memory 300 may enjoy the benefits described above.

Although discussed above in the context of spin-transfer torque, the magnetic barrier layers such as the layers 120, 120' and 120" and the magnetic junctions 100, 130, 150, 150', 160, 180 and/or other magnetic junctions including the magnetic barrier layer(s) within the pinned layer can be used in devices programmable using spin-orbit interaction (SO) torque. In such magnetic memories, the magnetic junctions 100, 130, 150, 150', 160 and 180 may be configured in a similar manner. However, dual magnetic junctions are generally not used. Instead, the free layers are adjacent to a spin-orbit active layer of a bit/word line through which an in-plane write current is driven. Although usable in other devices, such an SO torque programmable magnetic junction may find particular utility in a magnetic memory. Consequently, programming of the magnetic junctions 100, 130, 150, 150', 160, 180 and/or other magnetic junctions including a magnetic barrier layer is described in the context of an SO torque memory.

Figure 14:
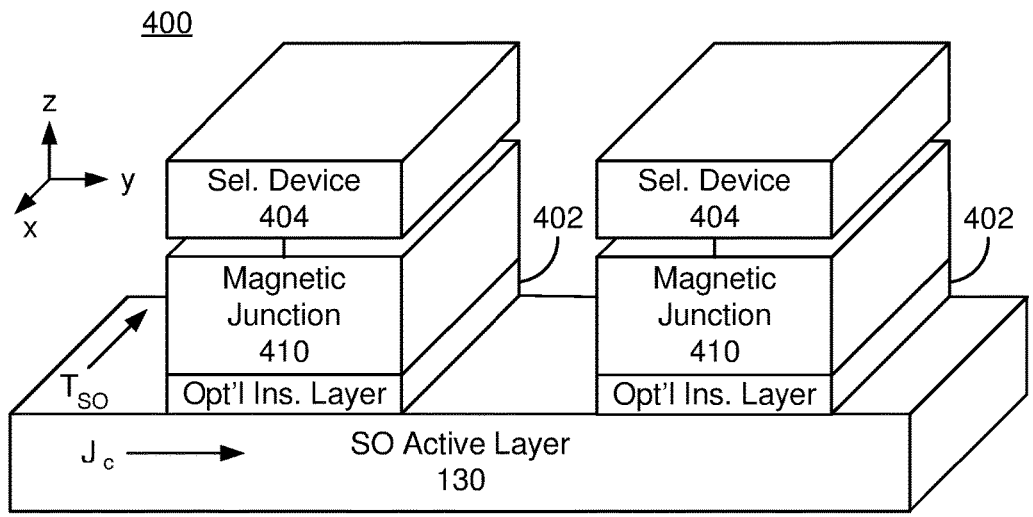
FIG. 14 depicts an exemplary embodiment of a magnetic device utilizing magnetic junctions including a pinned layer having a magnetic barrier layer and programmable using spin-orbit interaction torque.

FIG. 14 depicts an exemplary embodiment of a portion of a magnetic memory 400 programmable using SO torque and including magnetic junctions having the above-described magnetic barrier layer. For clarity, FIG. 14 is not to scale. In addition, portions of the magnetic memory 400 such as bit lines, row and column selectors are not shown. The magnetic memory 400 includes magnetic junctions 410, selection devices 404 and a spin-orbit interaction (SO) active layer 430. The SO active layer is adjacent to the free layer of the magnetic junction 410 and has a high spin-orbit interaction. The high spin-orbit interaction may be due to a bulk effect of the material itself (spin Hall effect), due to interfacial interactions (Rashba effect), some other effect and/or some combination thereof. The SO active layer is described in more detail below. Although the magnetic junctions 410 are depicted as residing on the SO active layer 430, in other embodiments, the order of components in the z-direction may be reversed.

Also shown in FIG. 14 is an optional insertion layer 402 that may be between the SO active layer 430 and the magnetic junction 410. However, an additional pinned layer would not be located between the free layer and the SO active layer 430. Thus, the magnetic junction 410 is a single junction. The selection device 404 may be a transistor. In other embodiments, other selection device(s) that may have other locations may be used. In still other embodiments, the selection device may be omitted and another mechanism, such as voltage controlled magnetic anisotropy, might be used to select the magnetic junction 410 for writing and/or reading. In the embodiment shown, a memory cell includes the magnetic junction 410 and the selection device 404. In other embodiments, a memory cell may include other and/or additional components. Typically, multiple magnetic junctions 410 and multiple memory cells are included in the magnetic memory 400. The magnetic memory 400 may be used in a variety of electronic devices.

The magnetic junction 410 is analogous to the magnetic junctions 100, 130, 150, 150', 160, 180 and/or other magnetic junctions including a magnetic barrier layer 120, 120', 120" and/or an analogous magnetic barrier layer. Thus, the pinned layer includes one or more magnetic barrier layers. The magnetic junction 410 may thus be fabricated using the one or more of the methods 200, 220 and 230. The magnetic junction 410 is configured such that the free layer (not shown in FIG. 14) is switchable between stable magnetic states using a write current which is passed through the SO active layer 430 in the plane of the SO active layer 430. Thus, the free layer of the magnetic junction 410 is programmable using SO torque. The free layer may be programmable in the absence of a write current driven through the magnetic junction 410. Stated differently, STT may not be needed to write to the magnetic junction 410. In other embodiments, a modest current driven through the magnetic junction 410 that generates STT and/or an external magnetic field/magnetic bias may be used to assist in switching the free layer magnetic moment. In the embodiment shown, the free layer may have its magnetic moment stable out-of-plane.

The SO active layer 430 is a layer that has a strong spin-orbit interaction and is used in switching the magnetic moment (not shown) of the free layer. A write current is driven in-plane along the length of the SO active layer 430 in the +y direction or the −y direction. The arrow $J_c$ in FIG. 14 represents the current density for the write current driven through the SO active layer 430 in the +y direction. This write current gives rise to an attendant SO interaction, which results in the SO torque $T_{SO}$ shown in FIG. 14. A write current in the −y direction would result in an SO torque in the opposite direction. The SO torques in the +x direction and the −x direction may be used to program the magnetic moment of the free layer to the desired state. SO torque occurs for a current driven in-plane in the SO active layer 430 and a spin-orbit interaction. This is in contrast to STT, which is due to a perpendicular-to-plane current flowing through the magnetic junction 410 and that injects spin polarized charge carriers into the free layer. In some embodiments, programming of the magnetic junction 410 is completed using SO torque alone. In other embodiments, another mechanism such as spin transfer may also be used in switching. The SO torque generated in the SO active layer 430 may thus be used in switching the magnetic moment of the free layer.

Although the SO active layer 430 is shown as a continuous layer, in other embodiments, the SO active layer may reside only in the regions adjacent to the magnetic junctions 410. In other areas, the material for the SO active layer 430 may be replaced with another material, such as a higher conductivity material. Consequently, the resistance of the word or bit line that includes the SO active layer 430 may be tailored as desired.

In operation, the magnetic junction 410 may be read in a conventional manner. Thus, a read current insufficient to program the magnetic junction 410 using STT may be driven through the magnetic junction 410 in the CPP (current perpendicular-to-plane) direction. The resistance of the magnetic junction 410 is based on the orientation between the free layer magnetic moment and the pinned layer magnetic moments. Thus, data may be read from the magnetic junction 410 by determining the resistance of the magnetic junction 410. In programming the magnetic junction 410, however, a write current corresponding to current density $J_c$ may be driven in-plane through the SO active layer 430. As discussed above, this current is used to generate an SO torque, which alone or in combination with other effects can switch the magnetic moment of the free layer to the desired stable state.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic device comprising:
   a plurality of magnetic junctions, each of the plurality of magnetic junctions including a free layer, a pinned layer and a nonmagnetic spacer layer, the nonmagnetic spacer layer being between the pinned layer and the free layer, the pinned layer having a pinned layer perpendicular magnetic anisotropy energy greater than a pinned layer out-of-plane demagnetization energy, the pinned layer including a high perpendicular magnetic anisotropy (PMA) layer including at least one nonmagnetic component, a magnetic layer and a magnetic barrier layer between the high PMA layer and the magnetic layer, the magnetic barrier layer consisting of Co and at least one of W and Mo, the magnetic barrier layer being a barrier to diffusion of the nonmagnetic component of the high PMA layer; and
   at least one spin-orbit interaction (SO) active layer adjacent to the free layer of the each of the plurality of magnetic junctions, the at least one SO active layer carrying a current in-plane, the at least one SO active layer exerting a SO torque on the free layer due to the current passing through the at least one SO active layer, the free layer being switchable between a plurality of stable magnetic states using the SO torque.

2. The magnetic device of claim 1 wherein the magnetic layer includes a glass-promoting component as deposited and is amorphous as-deposited.

3. The magnetic device of claim 2 wherein the magnetic layer consists of FeB.

4. The magnetic device of claim 1 wherein the nonmagnetic component of the high PMA layer includes Pt.

5. The magnetic device of claim 4 wherein the high PMA layer includes a Co/Pt multilayer.

6. The magnetic device of claim 1 wherein the magnetic barrier layer includes a plurality of Co layers interleaved with and sandwiching at least one nonmagnetic layer, the nonmagnetic layer including the at least one of Ta, W and Mo.

7. The magnetic device of claim 1 wherein the magnetic barrier layer includes an alloy of Co and the at least one of Ta, W and Mo.

8. The magnetic device of claim 1 wherein the pinned layer of each of the plurality magnetic junctions is a synthetic antiferromagnet and further includes:
   a nonmagnetic coupling layer; and
   an additional high PMA layer, the nonmagnetic coupling layer being between the additional high PMA layer and the high PMA layer and the magnetic layer.

9. A magnetic memory residing on a substrate and comprising:
   a plurality of magnetic storage cells, each of the plurality of magnetic storage cells including at least one magnetic junction, each of the at least one magnetic junction including a free layer, a pinned layer and a nonmagnetic spacer layer, the nonmagnetic spacer layer being between the pinned layer and the free layer, the pinned layer having a pinned layer perpendicular magnetic anisotropy energy greater than a pinned layer out-of-plane demagnetization energy, the pinned layer including a high perpendicular magnetic anisotropy (PMA) layer including at least one nonmagnetic component, a magnetic layer and a magnetic barrier layer between the high PMA layer and the magnetic layer, the magnetic barrier layer consisting of Co and at least one of W and Mo, the magnetic barrier layer being a barrier to diffusion of the nonmagnetic component of the high PMA layer; and
   at least one spin-orbit interaction (SO) active layer adjacent to the free layer of the each of the plurality of magnetic junctions, the at least one SO active layer carrying a current in-plane, the at least one SO active layer exerting a SO torque on the free layer due to the current passing through the at least one SO active layer, the free layer being switchable between a plurality of stable magnetic states using the SO torque.

10. The magnetic memory of claim 9 wherein the magnetic layer consists of FeB, wherein the high PMA layer includes a Co/Pt multilayer and wherein the nonmagnetic component includes Pt.

11. The magnetic memory of claim 9 wherein the magnetic barrier layer includes a plurality of Co layers interleaved with and sandwiching at least one nonmagnetic layer, the nonmagnetic layer including the at least one of W and Mo.

12. The magnetic memory of claim 9 wherein the magnetic barrier layer includes an alloy of Co and the at least one of W and Mo.

13. A method for providing device magnetic device, the method comprising:
   providing a plurality of magnetic junctions, each of the plurality of magnetic junctions including a free layer, a pinned layer and a nonmagnetic spacer layer, the nonmagnetic spacer layer being between the pinned layer and the free layer, the pinned layer having a pinned layer perpendicular magnetic anisotropy energy greater than a pinned layer out-of-plane demagnetization energy, the pinned layer including a high perpendicular magnetic anisotropy (PMA) layer including at least one nonmagnetic component, a magnetic layer and a magnetic barrier layer between the high PMA layer and the magnetic layer, the magnetic barrier layer consisting of Co and at least one of W and Mo, the magnetic barrier layer being a barrier to diffusion of the nonmagnetic component of the high PMA layer, the step of providing the pinned layer of each of the plurality of magnetic junction further including
      providing a high perpendicular magnetic anisotropy (PMA) layer including at least one nonmagnetic component;
      providing a magnetic barrier layer; and
      providing a magnetic layer, the magnetic barrier layer being between the high PMA layer and the magnetic layer, the magnetic barrier layer including Co and at least one of Ta, W and Mo, the magnetic barrier layer being a barrier to diffusion of the nonmagnetic component of the high PMA layer;
   providing at least one spin-orbit interaction (SO) active layer adjacent to the free layer of the each of the plurality of magnetic junctions, the at least one SO active layer carrying a current in-plane, the at least one SO active layer exerting a SO torque on the free layer due to the current passing through the at least one SO active layer, the free layer being switchable using the SO torque.

14. The method of claim 13 wherein the magnetic layer includes a glass-promoting component as deposited and is amorphous as-deposited.

15. The method of claim 14 wherein the magnetic layer consists of FeB and wherein the step of providing the high PMA layer further includes:
   providing a Co/Pt multilayer.

16. The method of claim 13 wherein the step of providing the magnetic barrier layer includes:
provseting a plurality of Co layers interleaved with and sandwiching at least one nonmagnetic layer, the nonmagnetic layer and including the at least one of W and Mo.

17. The method of claim 13 wherein the step of providing the magnetic barrier layer includes:
providing an alloy of Co and the at least one of W and Mo.

18. A method for providing device magnetic device, the method comprising:
providing a plurality of magnetic junctions, each of the plurality of magnetic junctions including a free layer, a pinned layer and a nonmagnetic spacer layer, the nonmagnetic spacer layer being between the pinned layer and the free layer, the pinned layer having a pinned layer perpendicular magnetic anisotropy energy greater than a pinned layer out-of-plane demagnetization energy, the pinned layer including a high perpendicular magnetic anisotropy (PMA) layer including at least one nonmagnetic component, a magnetic layer and a magnetic barrier layer between the high PMA layer and the magnetic layer, the magnetic barrier layer including Co and at least one of Ta, W and Mo, the magnetic barrier layer being a barrier to diffusion of the nonmagnetic component of the high PMA layer, the step of providing the pinned layer of each of the plurality of magnetic junction further including
providing a high perpendicular magnetic anisotropy (PMA) layer including at least one nonmagnetic component;
providing a magnetic barrier layer; and
providing a magnetic layer, the magnetic barrier layer being between the high PMA layer and the magnetic layer, the magnetic barrier layer including Co and at least one of Ta, W and Mo, the magnetic barrier layer being a barrier to diffusion of the nonmagnetic component of the high PMA layer, wherein the step of providing the magnetic layer further includes:
depositing the magnetic layer, the magnetic layer including a glass-promoting component and being amorphous as-deposited;
providing a sacrificial layer on the magnetic layer, the sacrificial layer including a sink for the glass-promoting component;
performing at least one anneal of the magnetic layer and the sacrificial layer at an anneal temperature greater than 300 degrees Celsius and not more than 475 degrees Celsius, the magnetic layer being at least partially crystallized after the at least one anneal; and
removing the sacrificial layer after the step of performing the at least one anneal; and
providing at least one spin-orbit interaction (SO) active layer adjacent to the free layer of the each of the plurality of magnetic junctions, the at least one SO active layer carrying a current in-plane, the at least one SO active layer exerting a SO torque on the free layer due to the current passing through the at least one SO active layer, the free layer being switchable using the SO torque.

19. The method of claim 18 wherein the step of providing the magnetic layer further includes:
depositing a sacrificial oxide layer on the magnetic layer before the step of depositing the sacrificial layer, the sacrificial oxide layer adjoining the magnetic layer and the sacrificial layer and wherein the step of removing the sacrificial layer further includes removing the sacrificial oxide layer.

* * * * *